United States Patent
Wang

(10) Patent No.: US 6,526,531 B1
(45) Date of Patent: Feb. 25, 2003

(54) THRESHOLD DETECTION FOR EARLY TERMINATION OF ITERATIVE DECODING

(75) Inventor: Xiao-An Wang, Allentown, PA (US)

(73) Assignee: Agere Systems Inc., Miami Lakes, FL (US)

(*) Notice: Subject to any disclaimer, the term of this patent is extended or adjusted under 35 U.S.C. 154(b) by 0 days.

(21) Appl. No.: 09/532,637

(22) Filed: Mar. 22, 2000

(51) Int. Cl.[7] .............................................. G06F 11/00
(52) U.S. Cl. ..................................................... 714/704
(58) Field of Search .............................. 714/704, 703, 714/758

(56) References Cited

U.S. PATENT DOCUMENTS

| | | | | |
|---|---|---|---|---|
| 4,107,650 A | * | 8/1978 | Luke et al. ................. | 714/762 |
| 5,563,897 A | * | 10/1996 | Pyndiah et al. ............. | 714/755 |
| 6,038,696 A | * | 3/2000 | Chouly et al. .............. | 714/786 |
| 6,421,804 B1 | * | 7/2002 | Lee ............................ | 714/755 |

* cited by examiner

Primary Examiner—Phung M. Chung
(74) Attorney, Agent, or Firm—Steve Mendelsohn; Ian M. Hughes

(57) ABSTRACT

An iterative decoder decodes a frame of encoded data that includes error detection information, and terminates the iterative decoding based on a comparison of the decoded frame with the error detection information. The iterative decoder may have a maximum number of specified iterations, but may terminate the number of iterations early under specified conditions. The encoded data includes error detection information for parity check calculation. Error detection information may be in accordance with an error detection code, such as a cyclic redundancy check (CRC) code. After each iteration of decoding, a parity check is calculated for the decoded frame. Early termination of decoding may occur prior to an intermediate iteration threshold M of iterations when the parity check value of the decoded frame is equivalent to the parity check value calculated from the error detection information. Early termination of decoding after M iterations may also occur when a difference in decoding error between frames is either i) below a minimum error distance threshold or ii) no longer monotonically decreasing.

27 Claims, 5 Drawing Sheets

THRESHOLD DETECTION FOR EARLY TERMINATION OF ITERATIVE DECODING

BACKGROUND OF THE INVENTION

1. Field of the Invention

The present invention relates to decoding of encoded data by a receiver in a telecommunication network, and, more particularly, to reducing the number of iterations of an iterative decoder.

2. Description of the Related Art

Many communication systems employ 1) multi-dimensional encoding of data with convolutional codes and 2) iterative decoding of the encoded data due to the relatively high coding gain and simple structure of an iterative decoder. Iterative decoding methods may employ "soft-in, soft-out" decoders for decoding data. In an iterative decoding scheme, encoded data is repetitively decoded until a predetermined number of decoding iterations complete.

The following may be of use to understand the encoding and decoding methods. A set of binary values u is defined in the Galois field-2(GF(2)) with elements $\{+1, -1\}$ where $-1$ is the "null" element under modulo-2 addition. The reliability value, or soft value, $L(u)$ is the log-likelihood ratio of the binary random values in U and is defined as the (natural) log of the ratio of the probability that the random variable U takes on the value $u=+1$ (logic 2) to the probability that the random variable U takes on the value $u=-1$ (logic 0). The sign of $L(u)$ is used as a hard decision by a detector or decoder, and the magnitude of $L(u)$ is used as a reliability statistic (value) for the hard decision.

In an iterative decoding scheme, the reliability values based on the information bits are updated at each iteration, utilizing the information extracted from the previous iteration. Decoding produces a posteriori reliability values for the output, decoded data. The a priori reliability values may either be the null set (logic 0 or 1, depending on definition) for the first iteration (since there is no a priori information) or, after the first iteration, extrinsic reliability values for the information bits from a previous iteration. The extrinsic reliability values are values based on indirect information contained in the decoded information bits, and may be generated from the a posteriori reliability values. In general, the a posteriori reliability values and/or the extrinsic reliability values of an iteration are employed as extrinsic information input to a decoder for decoding data during the next iteration.

FIG. 1 shows an iterative decoder 100 as may be employed in a turbo decoder of the prior art operating in accordance with, for example, the CDMA-2000 standard. The iterative decoder receives encoded data that may be formed as follows. A frame of data is encoded with a first block code and a first parity bit $X^{P1}$ is added to the encoded frame of data. The frame of data is also interleaved with mapping f(*) and encoded with a second block code (which may be equivalent to the first block code), and a second parity bit $X^{P2}$ is added to the encoded frame of data. The encoded data is combined with the interleaved and encoded data to form a set of systematic bits $X^S$ (e.g., using a product code).

The iterative decoder includes first and second decoders 101 and 104, interleavers 102 and 109 each applying the mapping f(*) to input data, de-interleaver 106 applying the inverse of the mapping f(*) to input data, and optional buffers 103, 105, 107, 108, and 110 used to temporarily store values during the decoding process. First and second decoders 101 and 104 apply respective decoding operations D1 (the inverse of the first block code) and D2 (the inverse of the second block code).

The iterative decoder completes one iteration as follows. First decoder 101 receives systematic bits $X^S$ (via 111) and parity bits $X^{P1}$ (via 112) of the received frame from, for example, an external memory 120. First decoder 101 also receives extrinsic information (e.g., both the reliability values (soft-data representing values for the decoded frame of data) and extrinsic reliability values) from buffer 107 (via 114). Extrinsic information for one decoder may be derived from the de-interleaved, decoded frame of data from the other decoder and parity bits $X^{P1}$ and/or and parity bits $X^{P2}$. For the first iteration, the extrinsic information provided to first decoder 101 may be initialized to the null set (logic 0 or 1, depending on definition). First decoder 101 performs decoding operation D1 on the systematic bits $X^S$ using the extrinsic information and parity bits $X^{P1}$ to generate soft data. The soft data from first decoder 101 is then interleaved by interleaver 109, and the interleaved soft data is provided as extrinsic information for second decoder 104 (via 115). Systematic bits $X^S$ are also interleaved by interleaver 102.

Second decoder 104 receives the interleaved extrinsic information (via 115), the parity bits $X^{P2}$ (via 113), and the interleaved systematic bits $X^S$ (via 116), and performs decoding operation D2 to generate soft data. The soft data from second decoder 104 is then de-interleaved by de-interleaver 106 and provided as the extrinsic information (via 114) for decoding the systematic bits $X^S$ in the next iteration by first decoder 101, thus ending a single iteration of decoder 100. Several iterations may be required to generate a decoded frame of data from the systematic bits $X^S$ and parity bits $X^{P1}$ and $X^{P2}$ to satisfy a predetermined threshold for bit error rate (BER) of the iterative decoder. Half of an iteration is defined to be all the operations around one of the two decoders 101 and 104.

After N iterations, the turbo decoder combines the extrinsic information from both decoders 101 and 104 with the systematic bits $X^S$ from the received frame to form the so called soft outputs against which the decision on the transmitted bits are made. In this iteration process, every frame of encoded data requires N iterations to decode, thus the number of computations is fixed. In general, more iterations of the iterative decoding process result in a lower bit error rate (BER) for the decoded output data. For typical implementations of the prior art turbo decoder of FIG. 1, 10 to 20 iterations may be needed for satisfactory BER of a decoded frame when signal-to-noise ratio (SNR) is low. Since the number of computations of a circuit implementing the iterative decoder is directly proportional to the number of iterations required for decoding, more iterations generally result in higher power consumption for the circuit. Consequently, improving the BER performance of the circuit is generally achieved at the expense of increased power consumption.

FIG. 2 shows simulated turbo decoder performance as BER versus SNR for different numbers of iterations for the iterative decoder of FIG. 1. The signals are modulated, encoded frames of 20,730 bits that are transmitted through a communication channel adding white, Gaussian noise to the signal. Referring to FIG. 2, higher numbers of iterations generally result in lower BER for the decoded frame. For relatively high SNR (greater than 0.9 dB in FIG. 2), a point (number of iterations) exists where more iterations do not necessarily result in lower BER. Typical choices for the total number N of decoding iterations are generally between 8 and 12 iterations for moderate to high SNR. However, the iterative decoding process may exhibit abnormalities when higher numbers of iterations are employed. For example, a plot of the BER curve versus number of iterations may not be monotonically decreasing (i.e., the BER may actually be worse with more iterations); and (ii) given a fixed number of iterations, BER may not be monotonically decreasing with the SNR of the input signal. Pathetic decoded frames of data in which errors may grow with more iterations cause the BER abnormality.

Methods of the prior art to reduce the number of computations, and hence the power consumption in the particular circuit implementation of the iterative decoder, focus on comparing the decoded output of two consecutive iterations, or occasionally two half iterations. If the decoded output data for the two iterations are "sufficiently close" to each other (according to a predefined measure), then the iterative decoding process may be terminated. Such predefined measure may simply be a total difference in decoded bits between frames being less than a predefined threshold that provides as error bound in the data of the decoded frame. However, some measures of "sufficiently close" require sophisticated mathematical computation, increasing the number of computations required. Second, these prior art approaches require two decoded output frames for a decision. Thus, even if an iteration produces the correctly decoded frame, an iterative decoder must wait for the result of the next iteration to "confirm" this event, resulting in unnecessary computations. Third, some measures of "sufficiently close" may still make an incorrect decision: a decoded frame of data containing errors may pass the "sufficiently close" test, even though the encoded frame would be correctly decoded after further iterations. For some telecommunication standards, such as 3G wireless standards, cyclic redundancy check (CRC) error correction codes are embedded into encoded data frames. While the CRC codes are employed to detect when a decoded frame includes an error, the error detection code in these applications is not employed for the early termination of iterative decoding. The CRC codes employed by the standards have at most 16 bits, which is not sufficient to keep the probability of the error event low if used as a measure for early termination of iterative decoding.

SUMMARY OF THE INVENTION

The present invention relates to iterative decoding of an encoded frame of data that includes error detection information employed for tests allowing early termination of iterative decoding. A parity check test for the decoded frame is calculated for the decoded frame and, for the first test, iterative decoding is terminated if the decoded frame is declared correct. In addition, the difference, or number of differently decoded bits, between decoded frames of two iterations may be tracked after iterative decoding reaches an intermediate iteration threshold. A test determines a coding iteration for which the tracked difference has a relative minimum value. For example, the test may track each difference value and select as output, decoded frame of data the decoded frame corresponding to the iteration having the minimum difference value. Alternatively, the test may determine whether, for a particular iteration, the difference as a function of iteration is no-longer monotonically decreasing. If, after an iteration, the number of differently decoded bits is not monotonically decreasing, iterative decoding is terminated. Implementations of the present invention reduce or eliminate i) unnecessary computations during iterative decoding, and ii) the BER abnormality caused by high numbers of decoding iterations.

In accordance with embodiments of the present invention, decoding of an encoded frame comprises decoding the encoded frame during a current iteration of iterative decoding to provide a decoded frame including decoded data and decoded error detection information. A parity value is calculated from the decoded data, and the parity value is compared with the decoded error detection information to determine if the data passes a parity check. If the decoded data passes the parity check, iterative decoding is terminated to provide the decoded data of the current iteration. Otherwise if the decoded data does not pass the parity check, a difference of errors between the decoded frame of the current iteration and a decoded frame of a previous iteration is calculated and iterative decoding is terminated in accordance with an error rate measure. The error rate measure employs the difference calculated for the decoded frame of the current iteration, wherein the error-rate measure indicates either i) achieving a relative minimum difference value or a relative maximum bound for bit-error rate, or a relative minimum in bit-error-rate for iterative decoding between the previous and current iterations.

In accordance with other embodiments of the present invention, decoding of an encoded frame comprises decoding, during a current iteration of iterative decoding, the encoded frame to provide a decoded frame of data. A difference between the decoded frame of the current iteration and a decoded frame of a previous iteration is calculated, the difference related to the number of errors in the decoded frame of the current iteration. Iterative decoding is terminated based on an error rate measure by comparing the difference calculated for the decoded frame of the current iteration with a difference calculated during the previous iteration, wherein the difference calculated during the previous iteration is related to the number of errors in the decoded frame of the previous iteration.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

In accordance with an embodiment of the present invention, an iterative decoder decodes a frame of encoded data that includes error detection information, and terminates the iterative decoding based on a comparison of a parity check for the decoded frame using the error detection information. The iterative decoder may require a maximum number N of iterations to provide an output decoded frame of data. After each iteration of decoding, a parity check is calculated for the decoded frame. Termination of decoding may occur prior to an intermediate iteration threshold of M iterations ($1 \leq M \leq N$) when the parity check value of the decoded frame is equivalent to the parity check value calculated from the error detection information. In accordance with another embodiment of the present invention, termination of decoding after M iterations may occur when a difference in decoding error between frames is below an error bound threshold related to a maximum bit-error-rate for a decoded frame. In accordance with a further embodiment of the present invention, termination of decoding after M iterations may occur when at the point where a difference in decoding errors between is no longer monotonically decreasing. The following embodiments are described with respect to iterative decoding in a turbo decoder operating in accordance with a code-division, multiple-access (CDMA) telecommunication standard, such as the CDMA-2000 used in wireless and cellular telephony. However, as would be apparent to one skilled in the art, the techniques described herein may be extended to other data communication systems employing an iterative decoding process.

Figure 3:
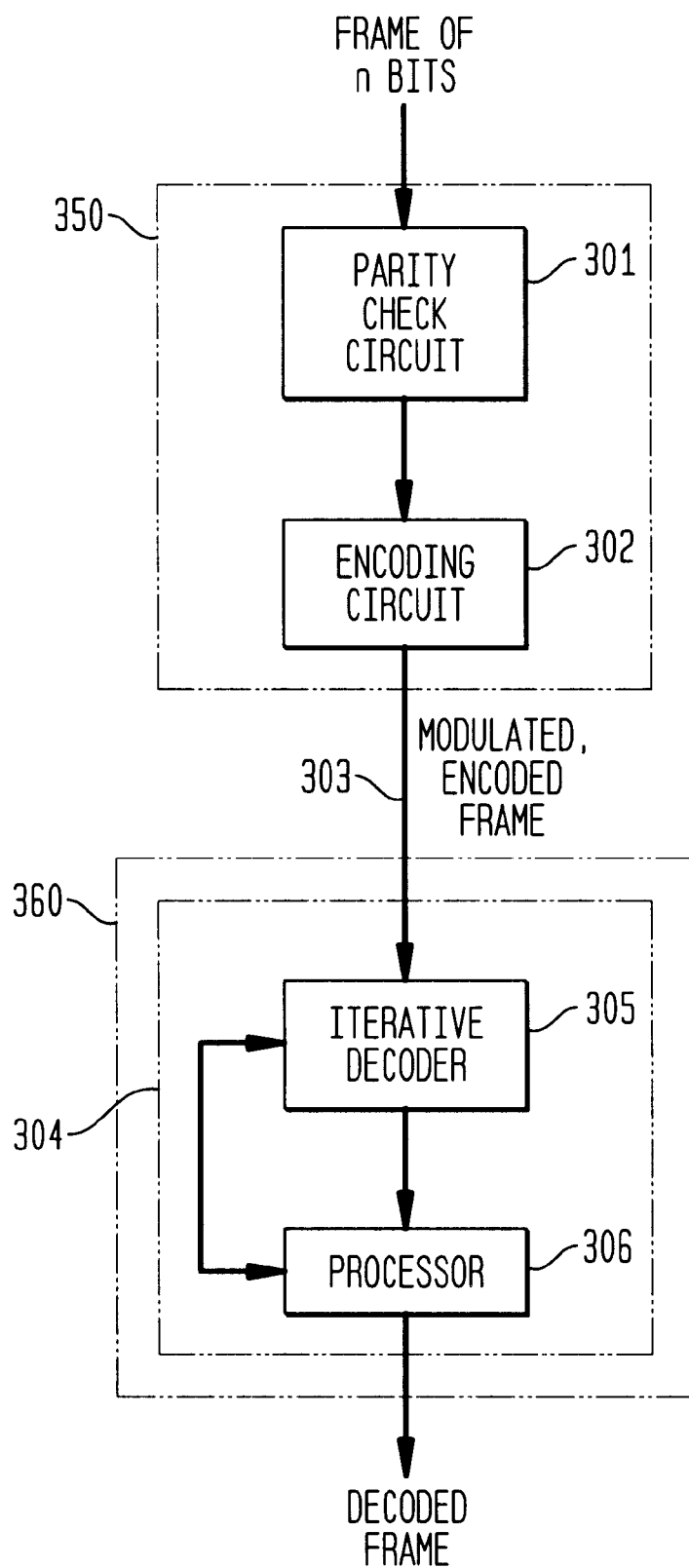
FIG. 3 shows an exemplary implementation of iterative decoding with early termination in accordance with an embodiment of the present invention.

FIG. 3 shows an exemplary implementation of iterative decoding with early termination in accordance with an embodiment of the present invention. Referring to FIG. 3, a transmitter 350 includes parity check circuit 301 and encoding circuit 302. Parity check circuit 301 processes the frame of n data bits to calculate c parity bits for the encoded data, and parity check circuit 301 also inserts the c parity check bits into the encoded data as error detection information. Encoding circuit 302 encodes the frame of length, or size, n+c bits in accordance with two convolutional block codes. Consequently, an encoded frame may be considered a code word from the resulting (n+c, n) error detection code. As would be apparent to one skilled in the art, many types of error detection codes may be employed for exemplary embodiments of the present invention. For example, cyclic redundancy check (CRC) codes are commonly employed, though other codes that offer better detection performance may also be employed.

The order of encoding and inserting parity check bits by parity check circuit 301 and encoding circuit 302 is exemplary only and one skilled in the art would readily recognize that other encoding and error detection code structures may be used. For example, the frame of n data bits may be encoded, parity check bits calculated for the encoded frame, and the error detection information including the parity check bits then inserted into the encoded frame.

The encoded frame is then modulated as a signal (e.g., a CDMA signal) and transmitted through the communication channel 303. Added noise and channel memory distort the signal as it passes through communication channel 303, inserting errors into the encoded frame. One skilled in the art would recognize that additional error detection and correction techniques may be applied to the encoded data frame for transmission, including bit interleaving/de-interleaving and multiplexing with other encoded data frames.

Figure 4:
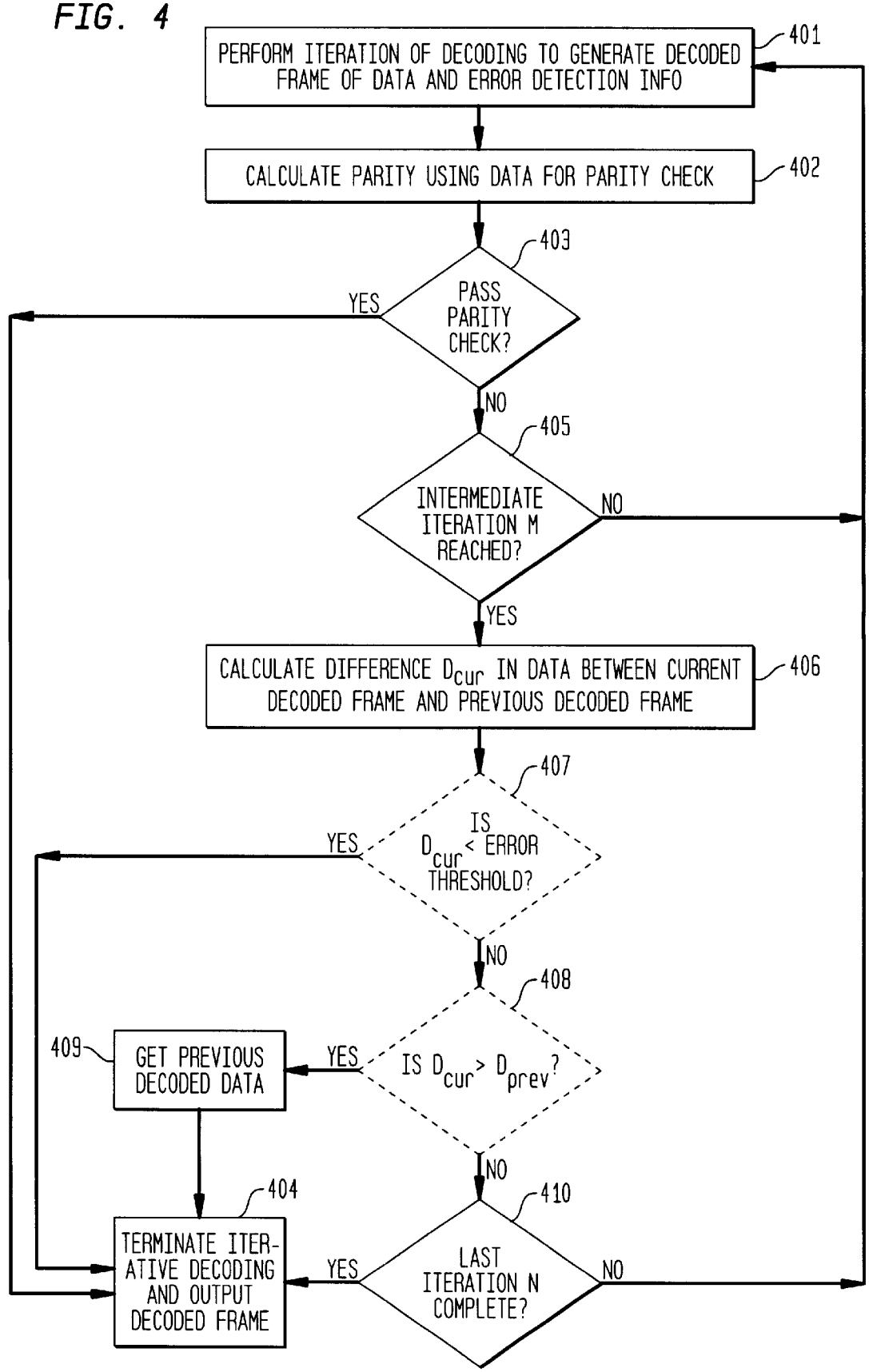
FIG. 4 shows a flowchart for an exemplary method of iterative decoding including minimum difference selection for early termination in accordance with the present invention.

A receiver 360 demodulates the signal from the communication channel 303 to provide the encoded frame of (n+c) bits to turbo decoder 304. Turbo decoder 304 decodes the encoded frame with an iterative decoding algorithm including early termination in accordance with an exemplary implementation of the present invention. Turbo decoder 304 includes iterative decoder 305 and processor 306. One skilled in the art may realize that both iterative decoder 305 and processor 306 may be implemented within the same general purpose processing module of, for example, an integrated circuit. FIG. 4 shows a flowchart for an exemplary method of iterative decoding with early termination as may be employed by the turbo decoder 304 of FIG. 3. In the following, the operation of the turbo decoder 304 is described with reference to both FIGS. 3 and 4.

Referring to FIG. 4, at step 401, an iteration of the iterative decoder 305 generates a decoded frame that includes data, or soft data, and error detection information. At step 402, the parity check value by processor 306 for the decoded frame is calculated using the soft data. Processor 306 calculates and checks the parity of the decoded frame using the error detection information (e.g., the inserted parity bits). At step 403, a test determines whether the calculated parity check value of step 402 is equivalent to the parity check value included in the error detection information. If the test of step 403 determines that the calculated parity check value of step 402 is equivalent to the parity check value included in the error detection information, the method proceeds to step 404. At step 404, processor 306 terminates iterative decoding of the frame by iterative decoder 305 and the decoded frame of the current iteration is provided as the output frame of decoded data.

Processor 306 may incorrectly determine that the decoded frame for an iteration is correct (i.e., an error event) if the decoded frame contains some errors positioned in a specific manner to satisfy the parity check calculation. However, for error detection codes commonly employed in communication systems, the probability of such an error event is approximately $2^{-c}$. Thus, if the number for c is selected as a sufficiently large value, this error event is nearly impossible. For example, for c=40, the error event has a probability of approximately $10^{-12}$. In typical applications, such as systems operating in accordance with a CDMA-2000 standard, the BER range for a decoded frame of data is less than $10^{-6}$, but is rarely less than $10^{-10}$. Consequently, this error event provides a negligible contribution to the overall BER of the turbo decoder. The overhead of added parity bits in the encoded data frame is also negligible, since the size of a data frame is generally relatively large (e.g., thousands of data bits). For example, for systems operating in accordance with the CDMA-2000 standard, the largest frame size is 20,730 bits. In contrast, the number c for parity bits is generally only on the order of tens of bits for the largest frame size.

Processor 306 also tracks the number of iterations. The iterative decoding process continues until either a decoded frame passes the parity check or after a pre-determined number M of iterations (i.e., the intermediate iteration M) is reached and detected by processor 306. Returning to FIG. 4, if the test of step 403 determines that the calculated parity check value of step 402 is not equivalent to the parity check value included in the encoded data frame, the method proceeds to step 405. At step 405 a test determines whether the current iteration is the $M^{th}$ iteration. If the test of step 405 determines that the $M^{th}$ iteration has not been reached, the method returns to step 401 for the next iteration.

Referring to FIG. 3, if processor 306 detects that no decoded frame has passed the parity check after the $M^{th}$ iteration (i.e., an intermediate iteration threshold is reached), the processor 306 monitors whether the number of decoding errors between decoded frames for each subsequent iteration. Processor 306 may implement one or both of two tests for implementing early termination of the decoding process by the iterative decoder 305. The following is described with respect to full iterations, but the present invention may operate using half iterations of the iterative decoder 305.

In accordance with exemplary embodiments of the present invention, a difference D of decoded bit values between the decoded frames of two consecutive iterations is tracked and may be used as a measure for early termination of iterative decoding. The difference D may be the total number of different, decoded data bits, but tracking of other forms of difference between decoded frames may alternatively be employed. During early iterations of the decoding process, the errors in the frame rapidly decrease and D is very large and so the iteration threshold M may be employed to reduce the number of unnecessary tracking and comparison operations during the early stages (iterations) of iterative decoding. When the number of errors in the frame reaches a relative minimum number, D tends to be small. Two implementations for a test based on the tracked difference in decoding errors between frames may be employed.

A first implementation determines whether the difference D in errors between two frames is smaller than a minimum error boundary threshold (determined from, for example, simulation), allowing for a maximum bound on the number or errors in the decoded data. Once a minimum error boundary threshold is detected, processor 306 determines that the decoded frame of data is correct and terminates decoding by iterative decoder 305. If processor 306 does not detect that either threshold is met or exceeded, processor 306 may allow iterative decoder 305 to continue decoding for the full number N of iterations to decode the encoded frame.

A second implementation determines whether, for a specific iteration, a curve or plot of the difference D versus decoding iteration is monotonically decreasing, and is termed herein the minimum difference selection (MDS) test. The second implementation is based on the BER abnormality of iterative decoding. Since simulations show that overall decoded frame BER exhibits abnormalities with high numbers of decoding iterations, the BER abnormality generally corresponds with a sudden jump in the number of errors, in which case the difference D begins to increase. For the preferred embodiment, the difference $D_{i,i+1}$ in errors between iterations i and i+1 is monitored after the intermediate iteration M. Waiting until iteration M may be preferred because: 1) a few iterations are necessary to reduce the total number of errors in decoding to a relatively small value; and 2) the parity check test may determine that a frame is correctly decoded before it becomes necessary to track the difference $D_{i,i+1}$1 in errors between iterations.

Referring to FIG. 4, if the test of step 405 determines that the iteration M has been reached, the method proceeds to step 406. At step 406, the decoded frame of the current iteration is compared to the decoded frame of the previous iteration to determine the difference $D_{cur}$. From step 306, the method may advance to one or both of steps 407 and 408.

At step 407, a test compares the difference $D_{cur}$ to an error threshold such as the error bound threshold determined as discussed previously. If the test of step 407 determines $D_{cur}$ is less than the error threshold, the method proceeds to step 404 to terminate decoding and provides the decoded frame of the current iteration as the output data. If the test of step 407 determines $D_{cur}$ is greater than or equal to the error threshold, the method proceeds either i) to step 408 if the MDS test is employed or ii) to step 410.

For the MDS test, processor 306 monitors whether the number of decoding errors is decreasing for each subsequent iteration or if a relative minimum difference point has been achieved. The difference of bit errors between frames is tracked at each iteration. During early iterations of iterative decoder 305, the value calculated for the difference with decrease with each iteration. However, when the value calculated for the difference begins to grow at a current iteration, the number of decoding errors is no longer monotonically decreasing. Consequently, the test detects the event of a bit error rate (BER) abnormality in iterative decoding. Therefore, the decoded frame of the previous iteration may correspond to a relative minimum difference point. In one embodiment of the present invention, the decoded frame at the previous iteration may have lowest or local minimum number of errors, and so iterative decoding may be terminated and the decoded frame at the previous iteration may be selected as the output decoded frame of data. In another embodiment of the present invention, as the difference in errors between frames decreases, the processor 306 may continue test for the difference at subsequent iterations up to the $N^{th}$ iteration. After N iterations, the decoded frame corresponding to the iteration having the lowest difference value over all calculated differences in errors may be may be selected as the output decoded frame of data.

Returning to FIG. 4, at step 408, the processor 306 compares the difference $D_{cur}$ to a previously calculated difference $D_{prev}$ to determine whether $D_{cur}$ is greater than $D_{cur}$. For the first test of step 408, $D_{prev}$ is set to a large value, such as the frame size. If the comparison of step 408 determines $D_{cur}$ is greater than or equal to $D_{prev}$, the method proceeds to step 409 to store the decoded frame of data from the previous iteration and the value for the difference. If iterative decoding is to be terminated upon first detection of a BER abnormality event, the method then proceeds to step 404 to terminate decoding and provides the decoded frame of the previous iteration as the output data. If iterative decoding completes all N iterations to determine the decoded frame corresponding to the lowest overall difference value, the method proceeds to step 410 to determine if the maximum number N of iterations has been reached. If all N iterations are complete at step 410, the method then proceeds to step 404 to terminate decoding and provides the decoded frame of the iteration having the lowest overall difference value as the output data.

If the test of step 407 determines $D_{cur}$ is less than or equal to $D_{prev}$, the method proceeds to step 410 to determine if the maximum number N of iterations has been reached. If step 410 determines that the maximum number N of iterations has been reached, the method proceeds to step 404 to provide the decoded frame of data of either the current iteration, or the iteration having the lowest overall difference value. If step 410 determines that the maximum number N of iterations has not been reached, the method returns to step 401 for the next iteration.

Figure 1:
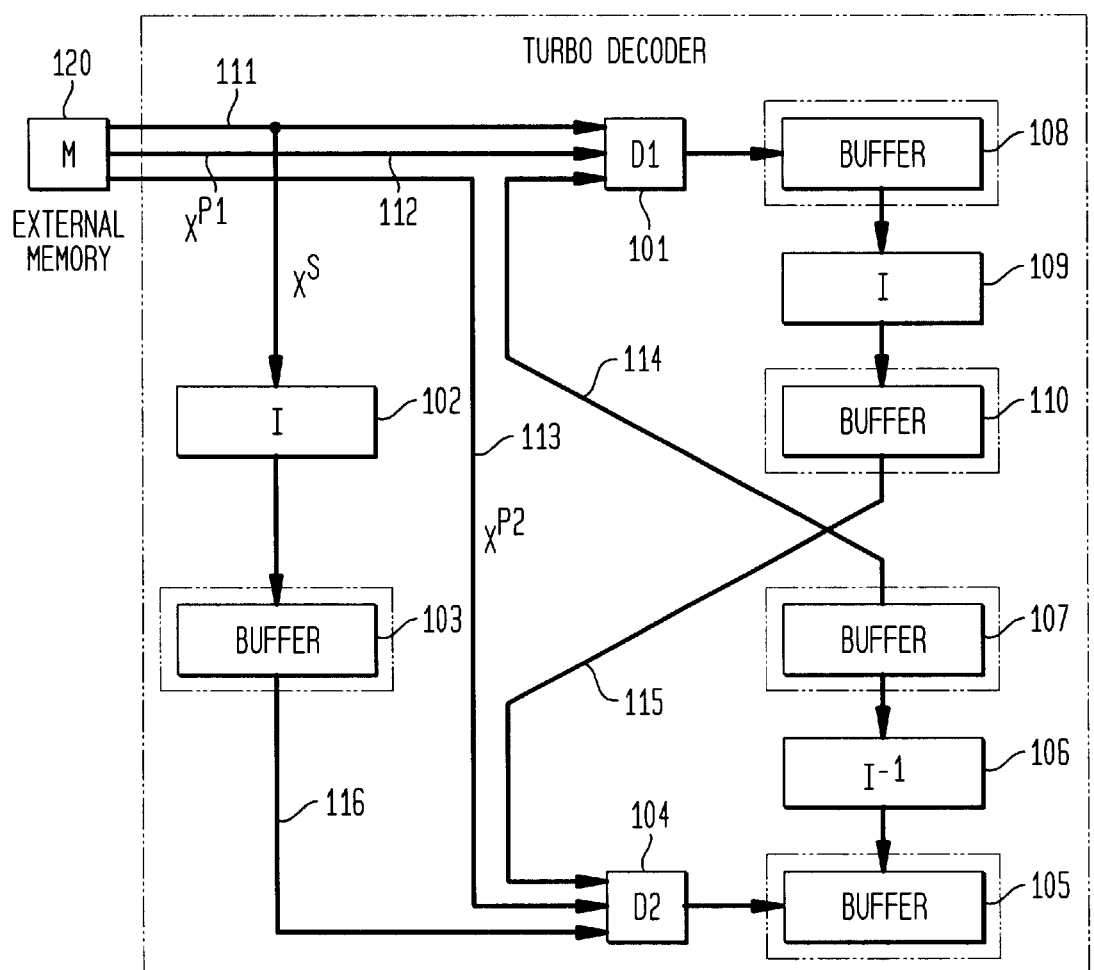
FIG. 1 shows an iterative decoder as may be employed in a turbo decoder of the prior art.
Figure 2:
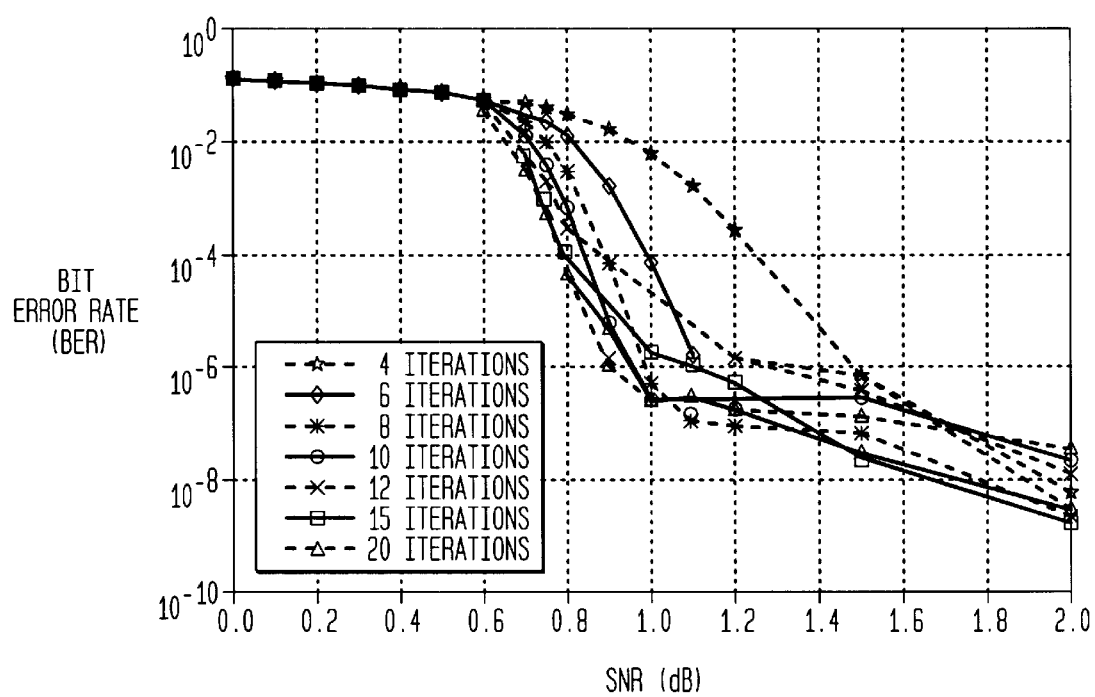
FIG. 2 shows simulated performance for the prior art iterative decoder of FIG. 1 for signals transmitted through a communication channel having additive white Gaussian noise.
Figure 5:
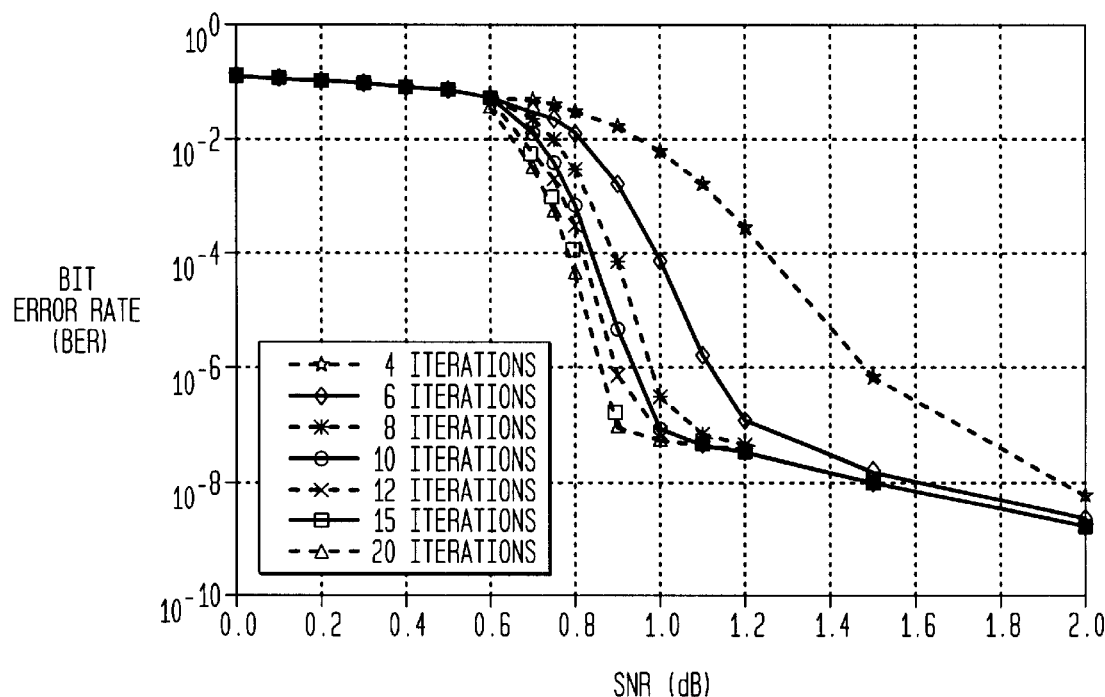
FIG. 5 is a graph showing simulated BER performance of a turbo decoder with error detection-based early termination and employing minimum difference selection in accordance with an exemplary implementation of the present invention.
Figure 6:
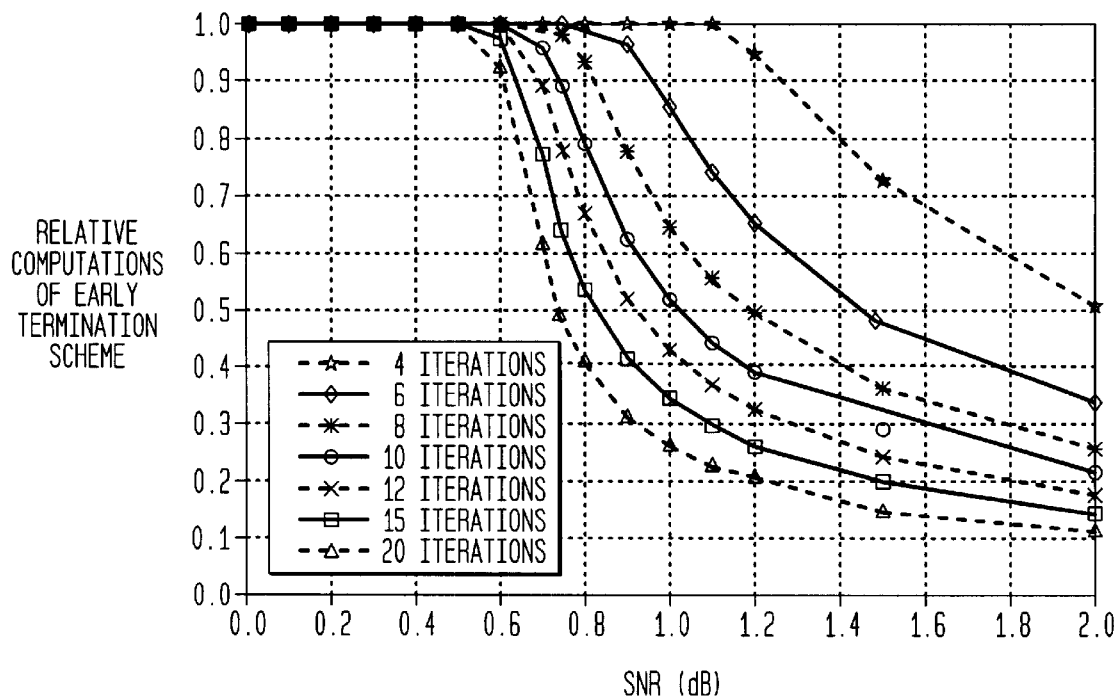
FIG. 6 is a graph of relative number of computations versus SNR corresponding to the simulation results shown in FIG. 5.

Performance of a turbo decoder decoding of signals encoded in accordance with the CDMA-2000 standard may be simulated. FIGS. 2, 5, and 6 show simulation results for similar conditions that allow for comparison between an iterative decoder of the prior art and an iterative decoder employing early termination. FIG. 2 shows simulated performance expressed as BER versus SNR for iterative decoding in accordance with the prior art, and FIG. 5 shows simulated performance expressed as BER versus SNR for iterative decoding with early termination in accordance with exemplary implementations of the present. FIG. 6 is a graph of relative number of computations versus SNR corresponding to the simulation results shown in FIG. 5. Relative number of computations is expressed as the ratio of i) the number of computations when early termination is employed for iterative decoding to ii) the total number N of iterations specified without early termination.

For each of the curves of FIGS. 2, 5, and 6, the curve is for a decoder with a total number N of iterations with values for N being 4, 6, 8, 10, 12, 15, and 20. N iterations decodes an encoded frame with acceptable BER performance, but not every frame requires N iterations to be correctly decoded. The simulation results given in FIGS. 2, 5, and 6 employ a signal of 600,000 encoded frames of 20,730 bits per frame, and the signal is transmitted through a wireless communication channel with additive, white Gaussian noise (AWGN). Table 1 gives the number of iterations, number of bit errors (errored bits across all frames, and number of frame errors (decoded frames having one or more bit errors) when the SNR is 1.5dB. Table 1 is an example that not all iterations are required to correctly decode a frame, and abnormality.

TABLE 1

| # of Iterations | # of Bit Errors | # of Frame Errors |
| --- | --- | --- |
| 1 | 549422487 | 600000 |
| 2 | 94100886 | 600000 |
| 3 | 2412637 | 386608 |
| 4 | 9276 | 3852 |
| 5 | 527 | 160 |
| 6 | 311 | 67 |
| 7 | 334 | 59 |
| 8 | 346 | 58 |
| 9 | 891 | 54 |
| 10 | 2451 | 58 |
| 11 | 7347 | 58 |
| 12 | 10701 | 57 |
| 13 | 8988 | 51 |
| 14 | 6147 | 52 |
| 15 | 2931 | 50 |
| 16 | 916 | 50 |
| 17 | 348 | 46 |
| 18 | 437 | 47 |
| 19 | 413 | 47 |
| 20 | 715 | 48 |

Referring to Table 1, the last column provides the number of error frames in each iteration and shows that most of the frames are correctly decoded after the first few iterations. For example, after 4 iterations, 99.4% of the frames are already correct, leaving only 0.6% of the frames that need further iterations. Since in general the chosen number of iterations N is in the range of 8 to 12, more than half of the computations are thus unnecessary. Moreover, as the last column in Table 1 indicates, some frames that are correctly decoded in early iterations are incorrectly decoded after higher numbers of iterations (e.g., the increase of frame errors between the $9^{th}$ and $10^{th}$ iterations).

Comparison of FIGS. 2 and 5 shows that iterative encoding employing early termination in accordance an implementation of the present invention provides little or no degradation in BER, and may have, in some cases, slightly better BER performance. Referring to FIGS. 5 and 6, the typical number of iterations required for decoding a frame is between 10 to 20 iterations, and the SNR range is above 0.9 dB to provide a BER for decoded frames below $10^{-6}$. As shown in FIG. 6 for this case, early termination results in only a small fraction of the computations that are needed without early termination.

An iterative decoder employing early termination in accordance with one or more exemplary implementations of the present invention may provide for several different combinations of tests for early termination of decoding. For example, one implementation may include performing a parity check of a decoded frame only as a test for early termination of iterative decoding. Another implementation may only test whether the difference in errors is monotonically decreasing between iterations for early termination of iterative decoding. Other implementations may further include waiting until an intermediate iteration before implementing one or more tests for early termination. In addition, two or more combinations of tests may be supported: a parity check followed by either an error bound test or a minimum error distance check.

An iterative decoder employing early termination in accordance with one or more exemplary embodiments of the present invention may provide the following advantages. First, early termination based on parity check is much more accurate than prior art early termination based on closeness measures, and the probability of an error event may be made extremely small by selecting a sufficient number of parity check bits. Second, early termination for circuits embodied in, for example, an integrated circuit are may exhibit reduced power consumption from reduced numbers of computations. Third, early termination may actually improve BER of decoded frames by reducing the likelihood of a BER abnormality condition. Fourth, error detection codes are relatively easy to implement, especially CRC codes, allowing for ease of circuit design.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention may be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. In a signal processing application, a method of decoding an encoded frame comprising the steps of:

a) decoding, during a current iteration of iterative decoding, the encoded frame to provide a decoded frame including decoded data and decoded error detection information;

b) calculating a parity value from the decoded data;

c) comparing the parity value with the decoded error detection information to determine if the data passes a parity check;

d) if the decoded data passes the parity check,
 1) terminating iterative decoding to provide the decoded data of the current iteration; otherwise, if the decoded data does not pass the parity check
 2) calculating a difference of errors between the decoded frame of the current iteration and a decoded frame of a previous iteration;

e) terminating iterative decoding in accordance with an error rate measure based on the difference calculated for the decoded frame of the current iteration, wherein the error-rate measure indicates either i) achieving a relative maximum bound for bit-error rate or ii) a relative minimum difference in errors for iterative decoding between the previous and current iterations.

2. The invention as recited in claim 1, wherein, for step e), the relative maximum bound is a bit-error-rate threshold for the decoded frame, and step e) terminates iterative decoding by comparing the bit-error-rate threshold with the calculated difference for the decoded frame of the current iteration.

3. The invention as recited in claim 1, wherein step e) terminates iterative decoding based on the comparison between i) the difference of errors calculated for a decoded frame of the previous iteration and ii) the difference in errors calculated for the decoded frame of the current iteration when the comparison indicates an increase in bit-error rate for iterative decoding by the current iteration.

4. The invention as recited in claim 1, wherein step e) terminates iterative decoding after repeating steps a) through e) for a total number N iterations of the iterative decoder, and further comprises the steps of:
 f) tracking each difference calculated in step e) of an iteration of the decoder; and
 g) providing the decoded frame of the iteration corresponding to a relatively minimum difference in errors as decoded data.

5. The invention as recited in claim 1, wherein steps a) through e) are performed when the current iteration for iterative decoding either meets or exceeds an intermediate iteration threshold.

6. The invention as recited in claim 1, wherein the method of steps a) through e) are implemented as program steps by at least one processor in an integrated circuit.

7. The invention as recited in claim 1, wherein the method of steps a) through e) are implemented by a processor of a transceiver operating in accordance with a code-division, multiple-access telecommunication standard.

8. In a signal processing application, a method of decoding an encoded frame comprising the steps of:
 a) decoding, during a current iteration of iterative decoding, the encoded frame to provide a decoded frame of data;
 b) calculating a difference between the decoded frame of the current iteration and a decoded frame of a previous iteration, the difference related to the number of errors in the decoded frame of the current iteration;
 c) terminating iterative decoding based on an error rate measure by comparing the difference calculated for the decoded frame of the current iteration with a difference calculated during the previous iteration, wherein the difference calculated during the previous iteration is related to the number of errors in the decoded frame of the previous iteration.

9. The invention as recited in claim 8, wherein, for step c), iterative decoding is terminated when the error-rate measure indicates an increase in bite error rate for iterative decoding between the previous and current iterations.

10. The invention as recited in claim 8, wherein, for step c), iterative decoding is terminated after a number N of iterations of the iterative decoder as an error-rate measure, and further comprises the steps of
 f) tracking each difference calculated in step b) of an iteration of the decoder; and
 g) providing the decoded frame of the iteration corresponding to a relatively minimum difference in errors as decoded data.

11. The invention as recited in claim 8, wherein steps a) through c) are performed when the current iteration for iterative decoding exceeds an intermediate iteration threshold.

12. The invention as recited in claim 8, wherein the method of steps a) through c) are implemented as program steps by at least one processor in an integrated circuit.

13. The invention as recited in claim 8, wherein the method of steps a) through e) are implemented by a processor of a transceiver operating in accordance with a code-division, multiple-access telecommunication standard.

14. In a signal processing application, a circuit for iterative decoding of an encoded frame of data, the circuit comprising:
 an iterative decoder decoding, during a current iteration, the encoded frame to provide a decoded frame having decoded data and decode error detection information; and
 a processor comprising:
  a parity check module calculating a parity value for the decoded data;
  a threshold detector comparing the parity value with the decoded error detection information to determine if the decoded data passes a parity check; and
 wherein, if the data passes the parity check, the processor terminates decoding by the iterative decoder to provide the data of the current iteration as a decoded frame; otherwise, if the data does not pass the parity check,
 the processor calculates the difference of errors between the decoded frame of the current iteration and a decoded frame of a previous iteration; and terminates decoding by the iterative decoder in accordance with an error rate measure based on the difference calculated for the decoded frame of the current iteration,
 wherein the error-rate measure indicates either i) achieving a relative maximum bound for bit-error rate or ii) a relative minimum difference in bit-error-rate for iterative decoding between the previous and current iterations.

15. The invention as recited in claim 14, wherein the relative maximum bound is a bit-error-rate threshold for the decoded frame, and the processor terminates iterative decoding by comparing the bit-error-rate threshold with the calculated difference for the decoded frame of the current iteration.

16. The invention as recited in claim 14, wherein the processor terminates iterative decoding based on the comparison between i) the difference of errors calculated for a decoded frame of the previous iteration and ii) the difference in errors calculated for the decoded frame of the current iteration when the comparison indicates an increase in bit-error rate for iterative decoding by the current iteration.

17. The invention as recited in claim 14, wherein the processor terminates iterative decoding after a total number N iterations of the iterative decoder, and the processor further:
   1) tracks the difference calculated for each iteration of the decoder; and
   2) provides the decoded frame of the iteration corresponding to a relatively minimum difference in errors as decoded data.

18. The invention as recited in claim 14, wherein the processor calculates the difference when the current iteration for iterative decoding either meets or exceeds an intermediate iteration threshold.

19. The invention as recited in claim 14, wherein the circuit is embodied in an integrated circuit.

20. The invention as recited in claim 14, wherein the circuit is embodied in a transceiver operating in accordance with a code-division, multiple-access telecommunication standard.

21. In a signal processing application, a circuit for iterative decoding of an encoded frame of data, the circuit comprising:
   an iterative decoder decoding, during a current iteration, the encoded frame to provide decoded data and decode error detection information; and
   a processor calculating a difference between the decoded frame of the current iteration and a decoded frame of a previous iteration, the difference related to the number of errors in the decoded frame of the current iteration;
   wherein the processor terminates iterative decoding based on an error rate measure by comparing the difference calculated for the decoded frame of the current iteration with a difference calculated during the previous iteration, wherein the difference calculated during the previous iteration is related to the number of errors in the decoded frame of the previous iteration.

22. The invention as recited in claim 21, wherein the processor terminates iterative decoding when the error-rate measure indicates an increase in bite error rate for iterative decoding between the previous and current iterations.

23. The invention as recited in claim 21, wherein iterative decoding is terminated after a number N of iterations of the iterative decoder as an error-rate measure, and the processor further:
   1) tracks each difference calculated for an iteration of the decoder; and
   2) provides the decoded frame of the iteration corresponding to a relatively minimum difference in errors as decoded data.

24. The invention as recited in claim 21, wherein the circuit is embodied in an integrated circuit.

25. The invention as recited in claim 21, wherein the circuit is embodied in a transceiver operating in accordance with a code-division, multiple-access telecommunication standard.

26. A computer-readable medium having stored thereon a plurality of instructions, the plurality of instructions including instructions which, when executed by a processor, cause the processor to implement a method of decoding an encoded frame, the method comprising the steps of:
   a) decoding, during a current iteration of iterative decoding, the encoded frame to provide a decoded frame including decoded data and decoded error detection information;
   b) calculating a parity value from the decoded data;
   c) comparing the parity value with the decoded error detection information to determine if the data passes a parity check;
   d) if the decoded data passes the parity check,
      1) terminating iterative decoding to provide the decoded data of the current iteration; otherwise, if the decoded data does not pass the parity check
      2) calculating a difference of errors between the decoded frame of the current iteration and a decoded frame of a previous iteration;
   e) terminating iterative decoding in accordance with an error rate measure based on the difference calculated for the decoded frame of the current iteration,
   wherein the error-rate measure indicates either i) achieving a relative maximum bound for bit-error rate or ii) a relative minimum difference in errors for iterative decoding between the previous and current iterations.

27. A computer-readable medium having stored thereon a plurality of instructions, the plurality of instructions including instructions which, when executed by a processor, cause the processor to implement a method of decoding an encoded frame, the method comprising the steps of:
   a) decoding, during a current iteration of iterative decoding, the encoded frame to provide a decoded frame of data;
   b) calculating a difference between the decoded frame of the current iteration and a decoded frame of a previous iteration, the difference related to the number of errors in the decoded frame of the current iteration;
   c) terminating iterative decoding based on an error rate measure by comparing the difference calculated for the decoded frame of the current iteration with a difference calculated during the previous iteration, wherein the difference calculated during the previous iteration is related to the number of errors in the decoded frame of the previous iteration.

* * * * *